United States Patent [19]

Ikeda et al.

[11] Patent Number: 5,155,737
[45] Date of Patent: Oct. 13, 1992

[54] SEMICONDUCTOR WAVELENGTH CONVERSION DEVICE

[75] Inventors: Masahiro Ikeda, Suginami; Osamu Mikami, Yokohama; Hiroshi Yasaka, Zama; Mitsuru Naganuma, Kunitachi; Shingo Uehara, Higashimurayama; Katsuhiko Kurumada, Ebina, all of Japan

[73] Assignee: Nippon Telegraph & Telephone Corporation, Tokyo, Japan

[21] Appl. No.: 788,784

[22] Filed: Nov. 6, 1991

[30] Foreign Application Priority Data

Nov. 7, 1990 [JP] Japan .................................. 2-299875

[51] Int. Cl.$^5$ ............................................. H04L 5/22
[52] U.S. Cl. ..................................... 372/43; 372/102
[58] Field of Search ........................... 385/8–10; 372/43, 49, 96, 102, 44, 45, 46

[56] References Cited

U.S. PATENT DOCUMENTS

| 4,888,783 | 12/1989 | Kojima et al. | 372/44 |
| 4,910,738 | 3/1990 | Fujita et al. | 372/18 |
| 5,040,183 | 8/1991 | Chen et al. | 372/25 |

FOREIGN PATENT DOCUMENTS 0285393  10/1988  European Pat. Off.
2-152289  6/1990  Japan.

OTHER PUBLICATIONS

S. Yamakoshi et al., OFC '88, Optical Fiber Communications Conference, Postdeadline Papers, "An Optical-Wavelength Conversion Laser with Tunable Range of 30 Å", New Orleans, LA., Jan. 25–28, 1988.
K. Sato et al., Conference Digest, 12th IEEE International Semiconductor Laser Conference, Davos, Switzerland, Sep. 9–14, 1990, "TM-Mode Gain Enhancement in InGaAs/InP Lasers with Tensile Strained-Layer Superlattice", p. 48.
Y. Suzuki et al., Applied Physics Letters, vol. 57, Dec. 24, 1990, No. 26, "Polarization mode selective channel waveguides in an InGaAs/InP disordered superlattice", pp. 2745–2747.
11th IEEE International Semiconductor Laser Conference, Aug. 29, 1988, Boston, MA, U.S., pp. 124–125; K. Kondo et al., A Tunable Optical-Wavelength Conversion Laser with Tm-Polarized Light Input.
IEEE Journal of Quantum ELectronics, vol. 24, No. 11, Nov. 1988, New York, U.S., pp. 2153–2159; H. Kawaguchi et al., Tunable Optical Wavelength Conversion Using an Optically Triggerable Multielectrode Distributed Feedback Laser Diode.
Patent Abstracts of Japan, vol. 14, No. 408 (E-972) Sep. 4, 1970 & JP-A-2 152 289 (Sumitomo Electric Ind. Ltd.).

Primary Examiner—Frank Gonzalez
Attorney, Agent, or Firm—Kenyon & Kenyon

[57] ABSTRACT

A wide band distributed Bragg reflector having a reflectivity extremely greater than that of a narrow band distributed Bragg reflector mirror portion on the output side of a bistable type wavelength conversion device is arranged on the incident side. The input light in TM polarization mode is used as an input signal light and the wavelength conversion is performed by tuning the narrow band distributed Bragg reflection mirror portion on the output side from which an output light in TE polarization mode outgoes perpendicularly to the input light. The input signal light and the output signal light are polarized in such a manner that they are perpendicular to one another and, therefore, the device can be realized as a one-directional device. The use of any isolator is not required.

21 Claims, 10 Drawing Sheets

SEMICONDUCTOR WAVELENGTH CONVERSION DEVICE

BACKGROUND OF THE INVENTION

1. Field of the Invention

The present invention relates to a small-sized semiconductor wavelength conversion device having a wide operating wavelength range, in which a bistable laser is used.

2. Description of the Prior Art

Figure 8:
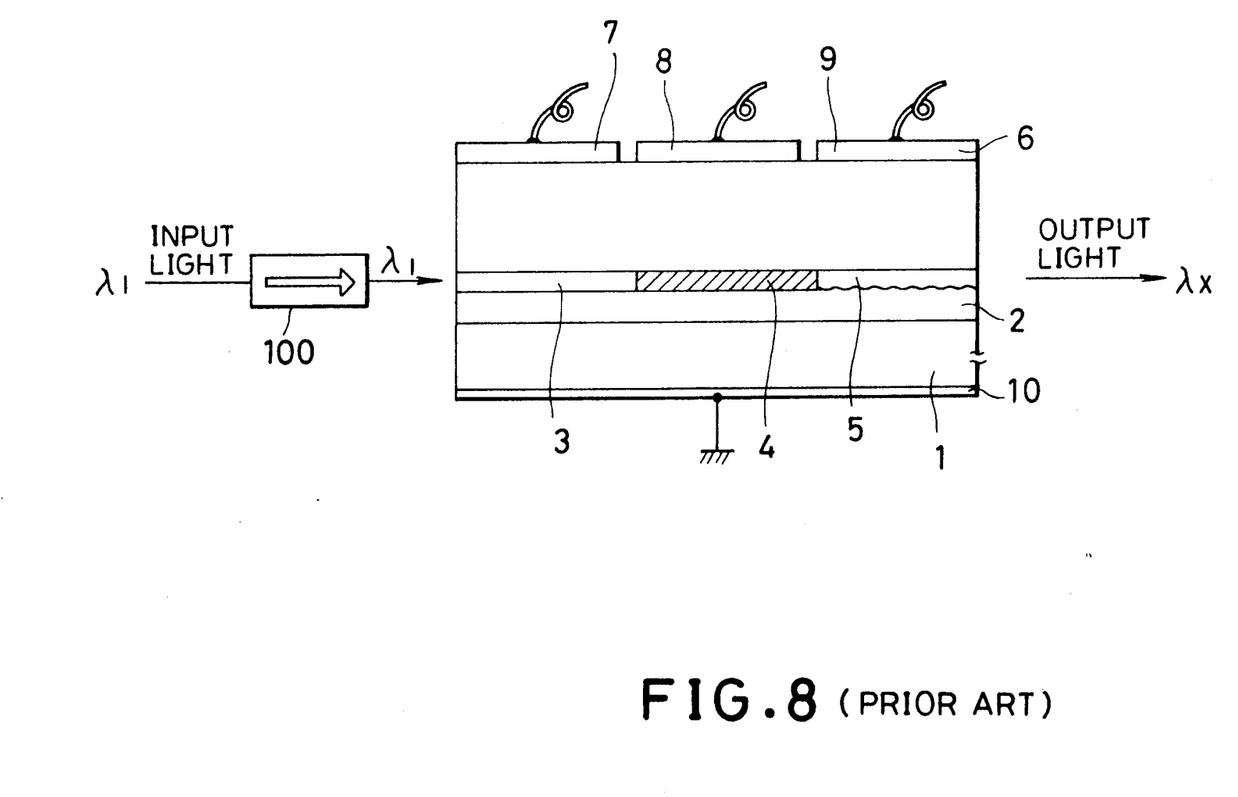
FIG. 8 is a cross sectional view showing an example of a conventional device.

An embodiment of conventionally known bistable type semiconductor wavelength conversion device is shown in FIG. 8 as a structural, cross-sectional view. In this figure, reference numeral 1 represents an n-type substrate of, for instance, n-InP; 2 an n-type semiconductor cladding layer of, for instance, n-InP formed on substrate 1; and 3, 4 and 5 a saturable absorber region, a gain region and a distributed Bragg reflector (DBR) mirror having a corrugation grating for selecting a wavelength of wavelength-converted light, which are formed on cladding layer 2. These waveguide layers 3 to 5 can be formed from InGaAsP. A p-type semiconductor cladding layer 6 of, for instance, p-InP is disposed on these regions 3 and 4 and corrugation grating 5 to give a ridge waveguide. An electrode 7 for the saturable absorber region, an electrode 8 for the gain region and an electrode 9 for the distributed Bragg reflector are arranged in desired areas on cladding layer 6 which correspond to the areas of regions 3 and 4 and corrugation grating 5, respectively. An electrode 10 is arranged on the opposite main face of substrate 1. Thus, the device is designed such that input light passing through an optical isolator 100 having a wavelength of $\lambda_1$ is made incident upon region 3.

In this device, an electric current is injected into active region 4 through electrode 8 for the gain region so that active region 4 has an optical gain and the wavelength conversion output light $\lambda_x$ is performed by input light $\lambda_1$. Simultaneously, wavelength $\lambda_x$ of the wavelength conversion output light is controlled through the change of the refractive index of distributed Bragg reflector mirror portion 5 by the injection of an electric current through tuning electrode 9.

The behavior of this device observed when a signal light having a wavelength $\lambda_1$ is made incident upon the device can be explained as follows (see S. Yamakoshi et al., Postdeadline Papers of OFC'88, PD-10 (1988)).

An output light of the bistable type wavelength conversion device having saturable absorber region 3 has an ON/OFF characteristic in which an output light is turned ON/OFF in response to a strength of an incident signal light when the loss in absorber region 3 is modulated by the incident signal light. The wavelength of the output light is determined by the Bragg wavelength of corrugation grating 5. Therefore, an electric current injected into electrode 9 can change the refractive index of corrugation grating 5, so that the output light wavelength can be changed. Accordingly, the output signal light controlled to have a wavelength different from that of the input signal light can be obtained. This is just the operation principle of the wavelength conversion device shown in FIG. 8.

The practical operation of this device requires the use of input power of not less than about 15 μW for an InGaAsP device operating at about 1.5 μm band and thus devices whose wavelength conversion range is not less than about 4.5 nm can be obtained.

Since such a conventional wavelength conversion device can emit conversion light in both forward and backward directions, the optical isolator 100 must be used in the conventional wavelength conversion device in order to prevent the influence of returned conversion light on preceding stage. The optical isolator is composed of a non-reciprocal substance and, therefore, cannot be incorporated into optical IC's. This causes fatal drawbacks when the wavelength conversion devices are integrated on the same wafer, since it is difficult to incorporate the optical isolator into a semiconductor wafer.

As has been discussed above, if a communication system is completely constituted from optical devices, the use of a large scale frequency switch is required, but such a large scale frequency switch cannot be obtained by simply combining conventional independent devices and, therefore, there has long been desired for the development of such a switch in the form of an optical IC.

SUMMARY OF THE INVENTION

Accordingly, it is an object of the present invention to provide a semiconductor wavelength conversion device in which a conversion light emitted from a bistable type wavelength conversion device does not return to the incident side without using any optical isolator and which is properly designed such that the devices can be integrated on the sam e wafer alone or in any combination with other devices.

The present invention provides a semiconductor wavelength conversion device comprising:
  a semiconductor substrate;
  a first cladding layer disposed on the semiconductor substrates;
  a second cladding layer;
  a saturable absorber region;
  a gain region;
  a distributed Bragg reflector mirror portion including a corrugation grating for selecting wavelength of a wavelength conversion light, the saturable absorber region, the gain region and the distributed Bragg reflector mirror portion being arranged on the first cladding layer;
  first, second and third electrodes separately arranged in areas on the second cladding layer, the areas corresponding to positions of the saturable absorber region, the gain region and the distributed Bragg reflector mirror portion, respectively; and
  a distributed Bragg reflector disposed on the light input side of the saturable absorber region, the distributed Bragg reflector having a corrugation grating which has a coupling coefficient greater than that of the corrugation grating of the distributed Bragg reflector mirror portion, the distributed Bragg reflector transmitting an input signal light of a first polarization mode, wavelength converted light in a second polarization mode which is perpendicular to the first polarization mode being derived from the distributed Bragg reflector mirror portion, a wavelength of the wavelength converted light being controlled by an injection current supplied from the third electrode.

Here, the first polarization mode may be TM polarization mode and the second polarization mode may be TE polarization mode.

The first polarization mode may be TE polarization mode and the second polarization mode may be TM polarization mode.

A cross sectional shape of a waveguide in the gain region may have a rectangular shape which is short in the direction of the layer thickness so that an optical confinement factor concerning optical confinement of a TE polarization mode light within the gain region is made greater than that of a TM polarization mode light within the gain region, thereby the wavelength converted light in the TE polarization mode being outputted.

A cross sectional shape of a waveguide in the gain region may have a rectangular shape which is long in the direction of the layer thickness so that an optical confinement factor concerning optical confinement of a TM polarization mode light within the gain region is made greater than that of a TE polarization mode light within the gain region, thereby the wavelength converted light in the TM polarization mode being outputted.

The gain region may have a unstrained or compressive strained quantum well structure, so that a material gain of the TE polarization mode light is made greater than that of the TM polarization mode light, whereby the wavelength converted light in the TE polarization mode is outputted.

The gain region may have a quantum well structure having a tensile strain, so that a material gain of the TM polarization mode light is made greater than that of the TE polarization mode light, whereby the wavelength converted light in the TM polarization mode is outputted.

The distributed Bragg reflector may have an optical waveguide which has a multiple quantum well structure.

The semiconductor wavelength conversion device may further comprise an optical amplifier arranged on the input side of the distributed Bragg reflector.

The semiconductor wavelength conversion device may further comprise a distributed feedback filter arranged on the input side of the distributed Bragg reflector.

The semiconductor wavelength conversion device may further comprise a polarization mixer arranged on the input side of the optical amplifier.

The semiconductor wavelength conversion device may further comprises a polarization mixer arranged on the input side of the distributed feedback filter.

The semiconductor wavelength conversion device may further comprise a waveguide portion for interrupting the input signal light and selectively transmitting the wavelength converted light, the waveguide portion being arranged on the output side of the distributed Bragg reflector mirror portion.

In the present invention, a wide band distributed Bragg reflector which has a reflectivity extremely greater than that of a narrow band distributed Bragg reflector mirror on the output side of a bistable type wavelength conversion device is arranged on the incident side. The input light in a first polarization mode, for instance, TM polarization mode (or TE polarization mode light) is used as an input signal light and the wavelength conversion is performed by tuning the Bragg wavelength of the narrow band distributed Bragg reflector mirror portion on the output side from which an output light in a second polarization mode, for instance, TE polarization mode (or TM polarization mode light) outgoes perpendicularly polarized to the input light.

The input signal light and the output signal light are polarized in such a manner that they are perpendicular to one another and, therefore, the device according to the invention can be realized as a one-direction device. For this reason, the use of any isolator is not required. Moreover, the distributed Bragg reflector on the incident side has a structure suitable for being incorporated into an optical IC and thus the semiconductor wavelength conversion device according to the present invention is suitable for monolithic integration on a semiconductor substrate alone or in any combination with other optical devices.

Japanese Patent Application Laying-Open No. 152289/1990 laid-open Jun. 12, 1990 discloses an optical amplifier having a structure similar to that of the device according to the present invention. In this optical amplifier, the reflectivity of the distributed Bragg reflector on the incident side is approximately equal to that of the reflector on the output side within a deviation of the order of about 3 to 5%. More specifically, this disclosure relates to a structure of an optical amplifier and accordingly it is necessary to make an input light incident upon the gain region and accordingly it is necessary to reduce the reflectivities of these distributed Bragg reflectors. As a result, the amplifier is so structured that a large amount of the output light returns to the input side. On the other hand, the present invention makes use of the structure in the form of a laser oscillator. To this end, the reflectivity of the distributed Bragg reflector on the input side, i.e., the product of the coupling coefficient and the length of the reflector must be greater than that of the distributed Bragg reflector on the output side.

As has been described above, in order to increase the reflectivity of the distributed Bragg reflector on the input side when the coupling coefficients at both input and output end faces are small and equal to one another, this reflector must have a large length. However, if the length of the reflector is increased, a transmission loss of the light increases and hence it is difficult to transmit the input light and this causes a practical problem. Therefore, the foregoing conventional technique can be applied neither to the optical amplifier nor to the device according to the present invention.

Further, if the coupling coefficients at both input and output end faces are great and equal to one another, any single-mode oscillation output cannot be obtained and, therefore, such a device never serves as a wavelength conversion device. The foregoing prior art does not have a wavelength conversion function.

The above and other objects, effects, features and advantages of the present invention will become more apparent from the following description of embodiments thereof taken in conjunction with the accompanying drawings.

DESCRIPTION OF THE PREFERRED EMBODIMENTS

Embodiment 1

Figure 1A:
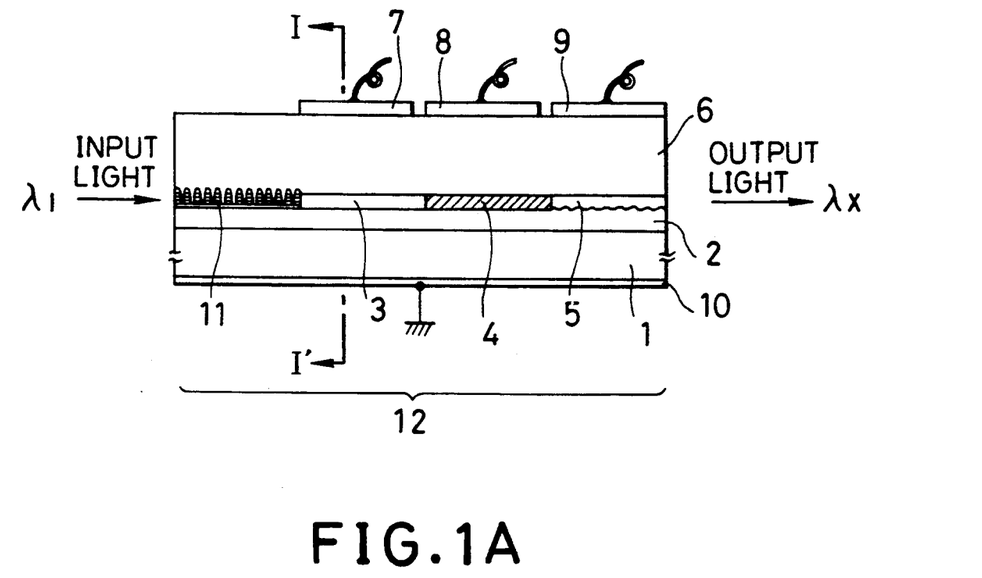
FIGS. 1A, 1B and 1C show a first embodiment of the semiconductor wavelength conversion device according to the present invention and are a longitudinal sectional view taken along the line II—II' in FIG. 1B, a transverse sectional view taken along the line I—I' in FIG. 1A and a perspective view thereof, respectively.
Figure 1B:
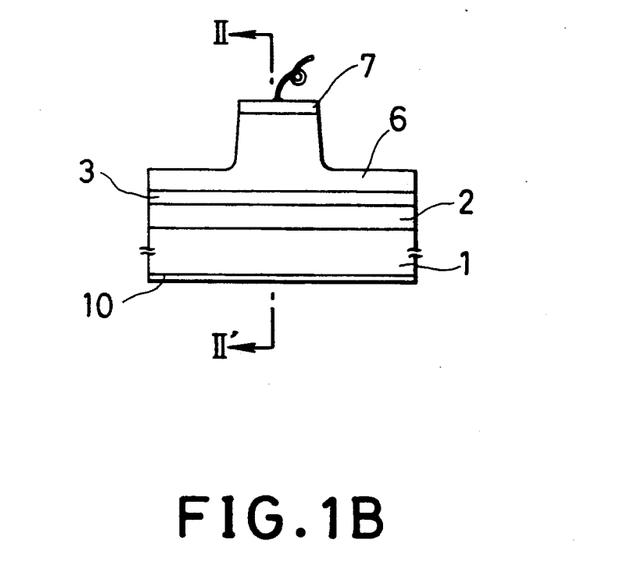
Figure 1C:
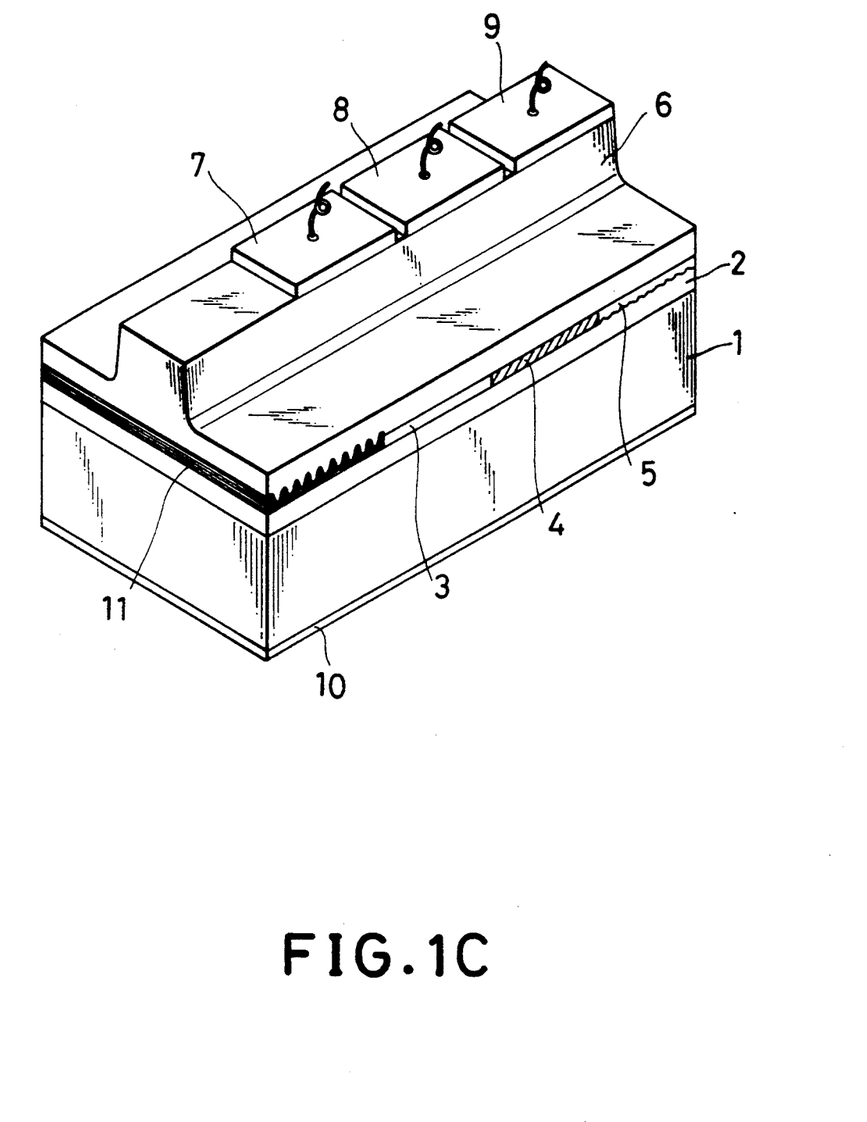

A first embodiment of the present invention in which the input light is a TM polarization mode light and the output light is A TE polarization mode light is shown in FIGS. 1A, 1B and 1C. In these figures, parts corresponding to those shown in FIG. 8 will be denoted by the same reference numerals. In these figures, reference numeral 11 denotes a distributed Bragg reflector which has a large coupling coefficient and is composed of a wide reflection band width having a very high reflectively disposed on the input side of region 6 between cladding layers 2 and 6, for instance, an optical waveguide having a multiple quantum will (MQW) structure. The reflectivity of distributed Bragg reflector 11 is greater than that of distributed Bragg reflector mirror 5.

The cross section shape of gain region 4 in the plane perpendicular to light propagation direction has a rectangular shape which is short in the direction of the layer thickness so that an optical confinement of TE polarization mode within the gain region is greater than that of TM polarization mode, which results in hat converted light oscillates in TE polarization mode.

Furthermore, even in the case that the cross sectional shape is not a rectangular shape which is short in the direction of the layer thickness, adoption of unstrained or compressive strained MQW structure in gain region 4 makes a material gain of TE polarization mode larger than that of TM polarization mode, which results in that the converted light oscillates in TE polarization mode.

Reference numeral 12 denotes the entire distributed Bragg reflector type wavelength conversion device which constitutes the wavelength conversion device according to this embodiment.

Figure 2:
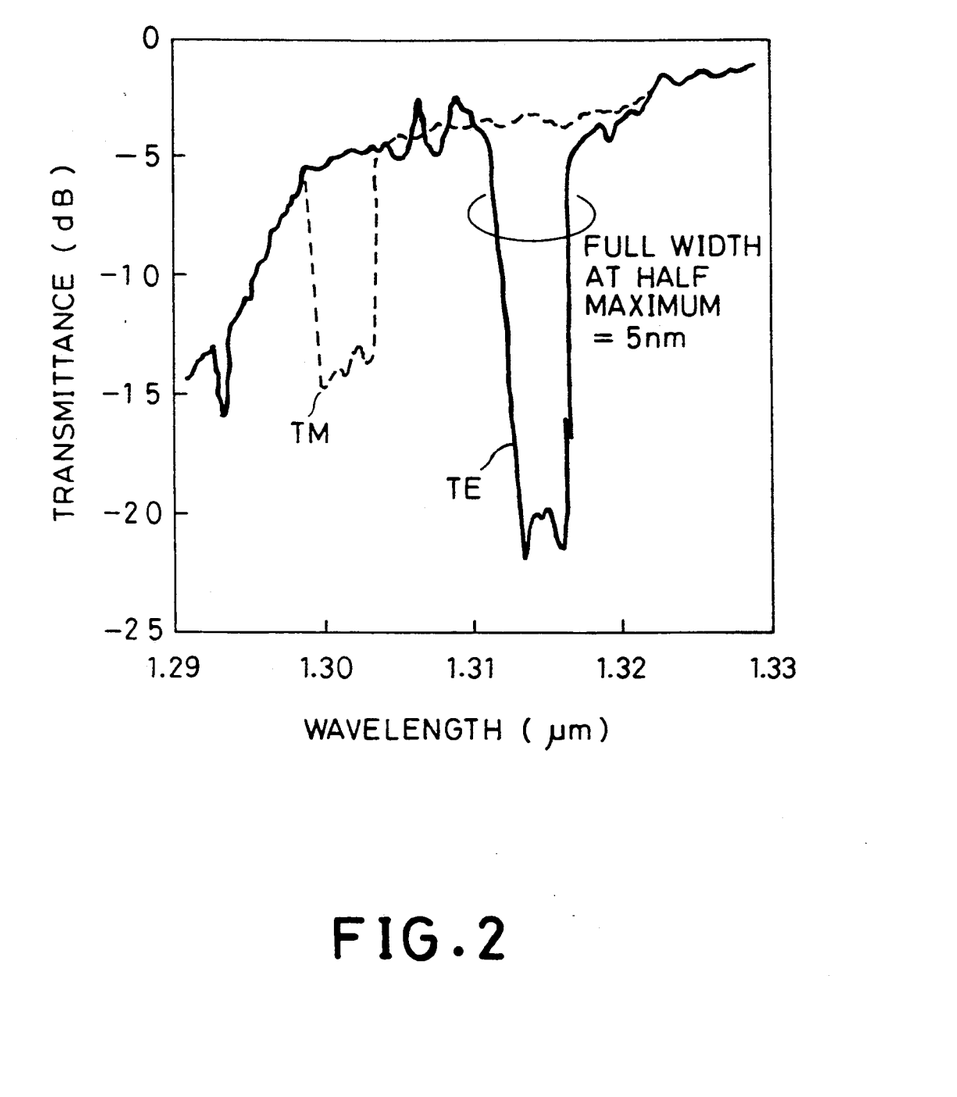
FIG. 2 is a graph in which the transmittance is plotted as a function of the wavelength observed on a strongly coupled distributed Bragg reflector.

FIG. 2 is a graph in which the transmittance is plotted as a function of the wavelength observed on distributed Bragg reflector 11. In this case, the MQW layer used is formed by depositing a well layer of InGaAsP having a thickness of 10 nm and a barrier layer of InP having a thickness of 10 nm using the metal organic molecular beam epitaxy (MO-MBE) method, this deposition operation is repeated over 20 cycles. A corrugation grating having a pitch of 0.2 μm and a depth of 0.13 μm is formed by direct exposure to an electron beam and by a dry etching process. The coupling coefficient of this corrugation grating is very great, i.e., of the order of 300 cm$^{-1}$ which is not less than ten times that of a usual corrugation grating of a DFB laser.

As seen from FIG. 2, there has been achieved wide band reflection characteristics, i.e., a central wavelength of about 1.315 μm and a full width at half maximum of 5 nm for TE polarization mode. On the other hand, the reflection band for TM polarization mode is obtained at a central wavelength of about 1.302 μm. This large different in central wavelength of the order of about 13 nm is due to the MQW structure used. In a usual distributed reflector having a bulk structure and a ridge waveguide structure, the difference in central wavelength is about 2.2 nm, which is about 1/6 time that of the reflector having the MQW structure.

The central wavelengths of both the TE and TM polarization mode can be shifted to other wavelength region, for instance, to about 1.5 μm wavelength region by changing the pitch of the corrugation grating.

Therefore, if it is assumed that the signal light wavelength of the TM polarization mode light falls within the range of reflection band wavelength region for the TE polarization mode light, the signal light can transmit through distributed Bragg reflector 11 on the input side. Accordingly, the signal light of the TM polarization mode light is absorbed by saturable absorber region 3 to modulate the loss in this region 3. The wavelength conversion device according to the present invention has the same structure already explained above in connection with the prior art except that the distributed Bragg reflectors are disposed on both input and output sides, that the distributed Bragg reflector on the input side is designed to be wide band and to have a high reflectivity, and that the wavelength conversion is performed by controlling the conversion light wavelength by the narrow band distributed Bragg reflector on the output side and, therefore, the wavelength conversion operation can of course be performed in accordance with the same manner.

Moreover, the width of the wavelength conversion band is determined by tuning the Bragg wavelength of the distributed Bragg reflector on the output side and may be up to about 4.5 nm. Distributed Bragg reflector 11 on the input side serves as a strongly coupled distributed Bragg reflector and accordingly the reflectivity for the TE polarization mode light can exceed 90% or more and the transmittance can be lowered 0.01% or less. This means that almost no TE polarized light leaks to the input side. For this reason, any isolator usually used is not required.

The reflectivity of the reflector with respect to the TE polarization mode light can be increased further, when a corrugation grating having a small coupling coefficient is used in the long distributed Bragg reflector on the input side, and hence any return of the light to the input side can be prevented. However, the transmittance of the TM polarization mode input light is decreased due to a loss inevitably inherent to the waveguide and thus such a device does not exhibit any desired wavelength conversion function.

The greater the coupling coefficient of the corrugation grating of the distributed Bragg reflector on the input side is, the smaller the return of the output light towards the input side is. Assuming that the length of the distributed Bragg reflector on the input side is 300 μm, the length of the distributed Bragg reflector mirror on the output side is 300 μm, the loss in the waveguide is 10 cm$^{-1}$, the coupling coefficient of the corrugation grating of the distributed reflector mirror on the output side is 30 cm$^{-1}$, and the coupling coefficient of the distributed Bragg reflector on the input side is 150 cm$^{-1}$ or more, it is possible to ensure that the ratio of the intensity of the output light emitted from the output side to that returned backward direction on the input side is −30 dB or less.

Embodiment 2

In a second embodiment of the present invention, the reflector has the same structure used in Embodiment 1 except that the input light is TE polarization mode and the output light is TM polarization mode. In this case, a tensile strained quantum well structure is used in gain region 4 in FIG. 1. It has been reported that the semiconductor laser in which the gain region is designed so as to have a tensile strained quantum well structure can oscillate TM polarization mode light (K. Sato et al., 12th IEEE International Semiconductor Laser Conference, Davos, Switzerland, Sep. 9–14, 1990, p. 48).

Alternatively, the gain region may be formed as a high mesa structure and the waveguide may be designed such that the cross section thereof has a rectangular shape which is extended in the direction of the layer thickness. In this case, the confinement factor of TM polarization mode within the gain region is larger than that of TE polarization mode, which results in that wavelength converted light oscillates in TM polarization mode.

Since the effective gain for laser oscillation is determined by the product of material gain of active region and confinement factor, it is of course much better for TM polarization oscillation to adopt both the tensile strained quantum well structure and the high mesa structure.

Embodiment 3

Figure 3A:
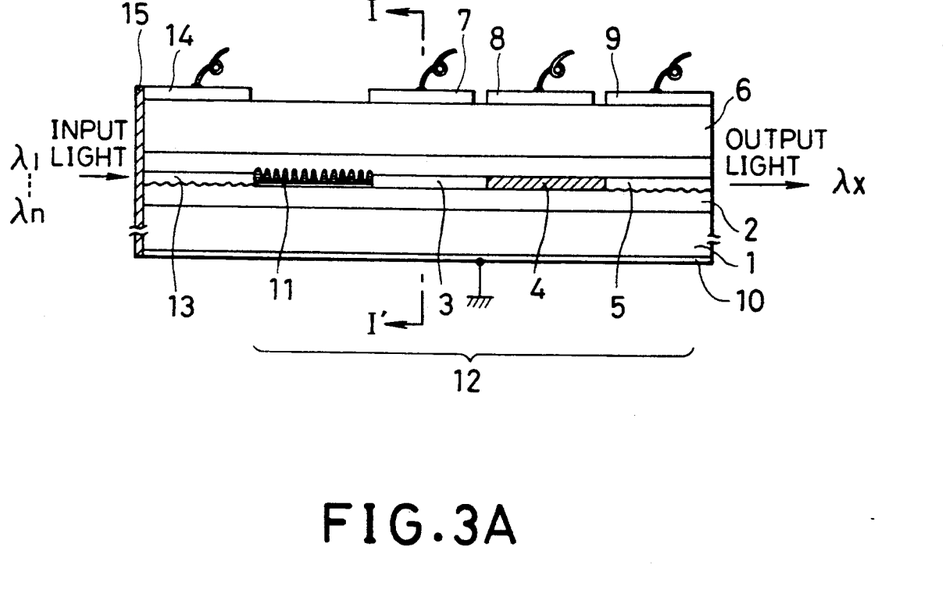
FIGS. 3A, 3B and 3C show a third embodiment of the present invention and are a longitudinal sectional view taken along the line II—II' in FIG. 3B, a transverse sectional view taken along the line I—I' in FIG. 3A and a perspective view thereof, respectively.
Figure 3B:
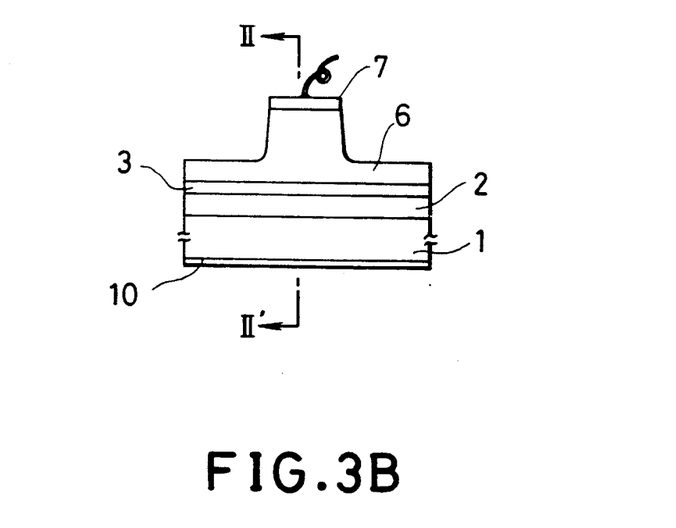
Figure 3C:
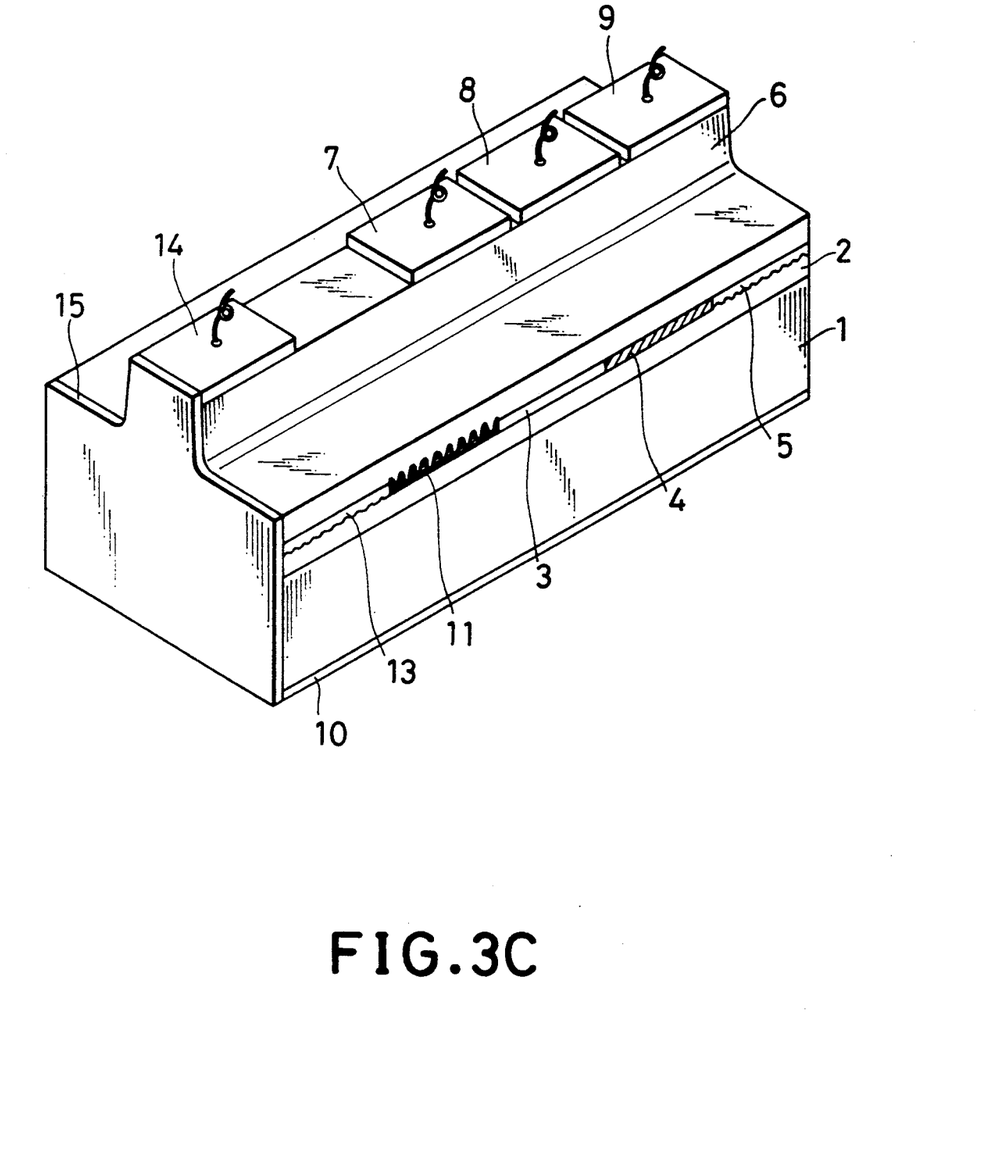

FIGS. 3A, 3B, and 3C show a third embodiment of the wavelength conversion device according to the present invention which is incorporated into a frequency switching device. The wavelength conversion device and a wavelength selection device are integrally formed as an integrated circuit into the switching device.

In the figures, reference numeral 13 denotes a distributed feedback filter for wavelength selection disposed between cladding layers 2 and 6 on the input side of distributed Bragg reflector 11; 14 an electrode for wavelength selection disposed in an area on cladding layer 6 which corresponds to the position of distributed feedback filter 13; 15 polarization mixers disposed on end faces on which input lights $\lambda_1, \ldots, \lambda_n$ are made incident.

In this embodiment, distributed feedback filter 13 selects a specific wavelength signal light from a plurality of multiple wavelength signal lights to input a specific signal light selected to distributed reflector 11, while wavelength conversion device 12 converts the selected input signal into a light which is polarized perpendicularly to the input lights and has different wavelength and then the converted lights is outputted. The tuning bandwidth and the transmitting bandwidth of distributed feedback filter 13 are the same as the tuning bandwidth and the reflection bandwidth of distributed Bragg reflector at the output side, respectively.

Alternatively, distributed feedback filter 13 may be an optical amplifier designed so as to obtain an optical gain in the same manner as that employed in the DFB laser structure. In this case, the structure is preferably such that the gain with respect to the polarized light on the input side (for instance, TE polarization mode light) becomes high. More specifically, it is preferred to adopt a DFB structure having an unstrained or compressively strained super lattice layer structure when a TE polarization mode light is inputted. On the other hand, a DFB structure having a tensile strained super lattice layer structure is preferably selected when a TM polarization mode light is inputted.

Furthermore, it is also desirable that the corrugation grating be formed within the plane perpendicular to the substrate or perpendicular to the plane of the usual corrugation grating. In other words, corrugation grating 13 shown in the figures is rotated around the optical axis by an angle of 90°. In this case, the waveguide layer may be either a bulk layer or a multiple quantum well layer.

It is a matter of course that an optical amplifier may be incorporated independently of distributed feedback filter 13.

Further, if the input signal light does not include any polarization mode light component (e.g., TM polarization mode light) which is determined so as to transmit the distributed Bragg reflector on the input side, it is necessary to generate the polarization mode light (TM polarization mode light) component by polarization mixer 15. This polarization mixer can be formed by an SiO$_2$ film processed into a simple diffuser structure.

Embodiment 4

Figure 4A:
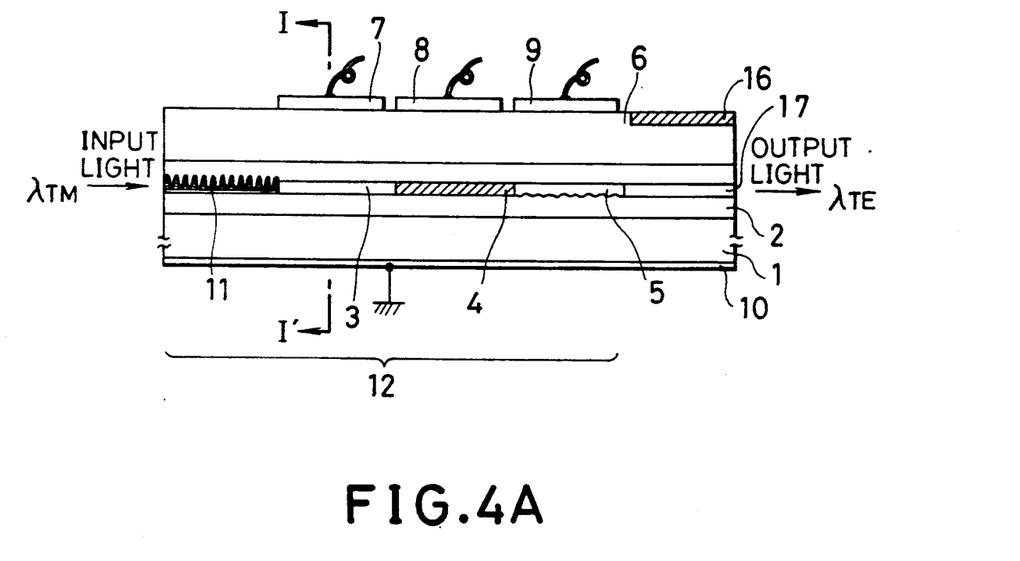
FIGS. 4A, 4B and 4C show a fourth embodiment of the present invention and are a longitudinal sectional view taken along the line II—II' in FIG. 4A, a transverse sectional view taken along the line I—I' in FIG. 4A and a perspective view thereof respectively.
Figure 4B:
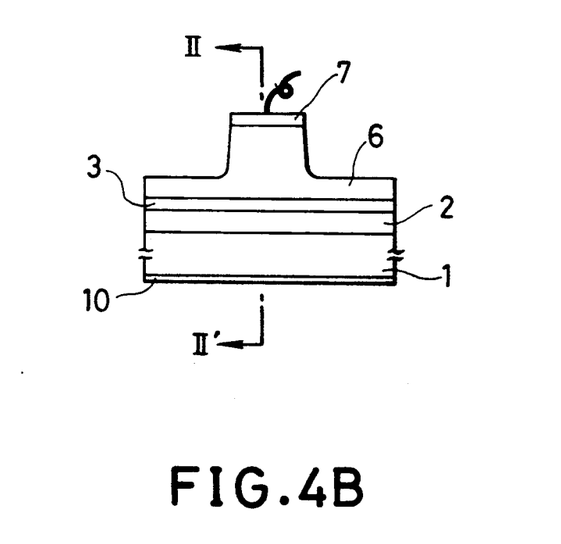
Figure 4C:
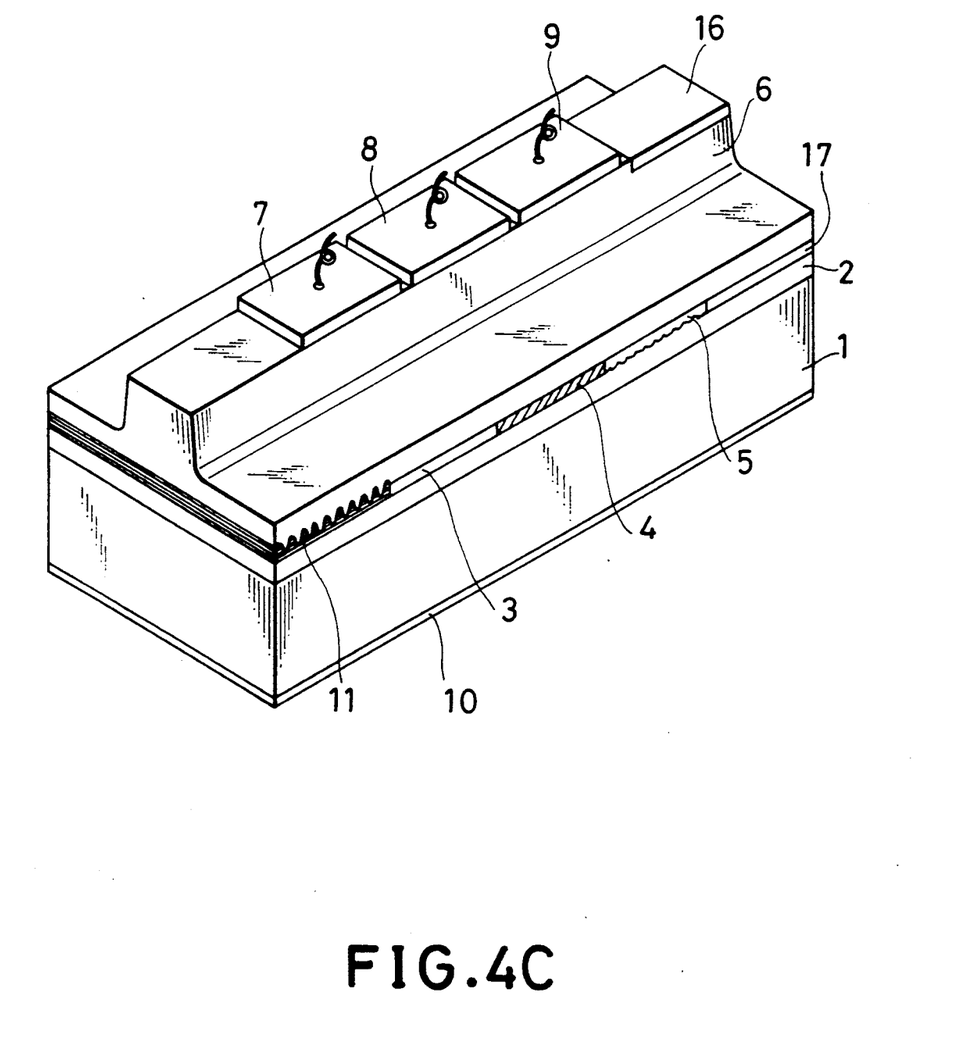

FIGS. 4A, 4B and 4C show a fourth embodiment of the device according to the present invention in which the input light is TM polarization mode light and the output light is TE polarization mode light. In these figures, reference numeral 16 denotes a metal film arranged on cladding layer 6 on the output end face side; and 17 an output waveguide which extends from the edge of the active layer of distributed Bragg reflector mirror portion 5 on the output end face side. If a TE polarization mode light is used as the input light, the TM polarization mode light as the output signal light and the input signal light as such are outputted from the device. Thus, it is necessary to diminish only the TM polarization mode light. To this end, the metal film is applied onto the output waveguide layer in this embodiment.

This method has in general been used when a TE polarization mode light is separated from a TM polarization mode light in optical IC circuits and it is easy to obtain an isolation of 20 dB or more.

On the other had, if the input light is TE polarization mode light and the output light is TM polarization mode light, it is sufficient to provide, as the output waveguide, a TM polarized light-selective waveguide which extends ahead of distributed Bragg reflector mirror 5. Such an optical waveguide has been proposed by Y. Suzuki et al., Appl. Phys. Lett., Vol. 57, p. 2745 (1990).

In the foregoing embodiments, The semiconductor optical waveguides are formed from InP materials, but the present invention is by no means limited to these specific examples and, for instance, GaAs materials may likewise be used. In addition, the conductive types of each semiconductor material used in the foregoing embodiments, i.e., p-type and n-type may be interchanged. Moreover, while optical waveguides having a wedge type structure are used in the foregoing embodiments, the present invention is by no means limited to the specific structure and, for instance, buried waveguides may of course be employed.

In the device according to the present invention, the distributed Bragg reflectors used on the input and output sides are provided with corrugation gratings having different coupling coefficients. A preferred range of the coupling coefficient κ of the reflector will herein be analyzed.

Figure 5:
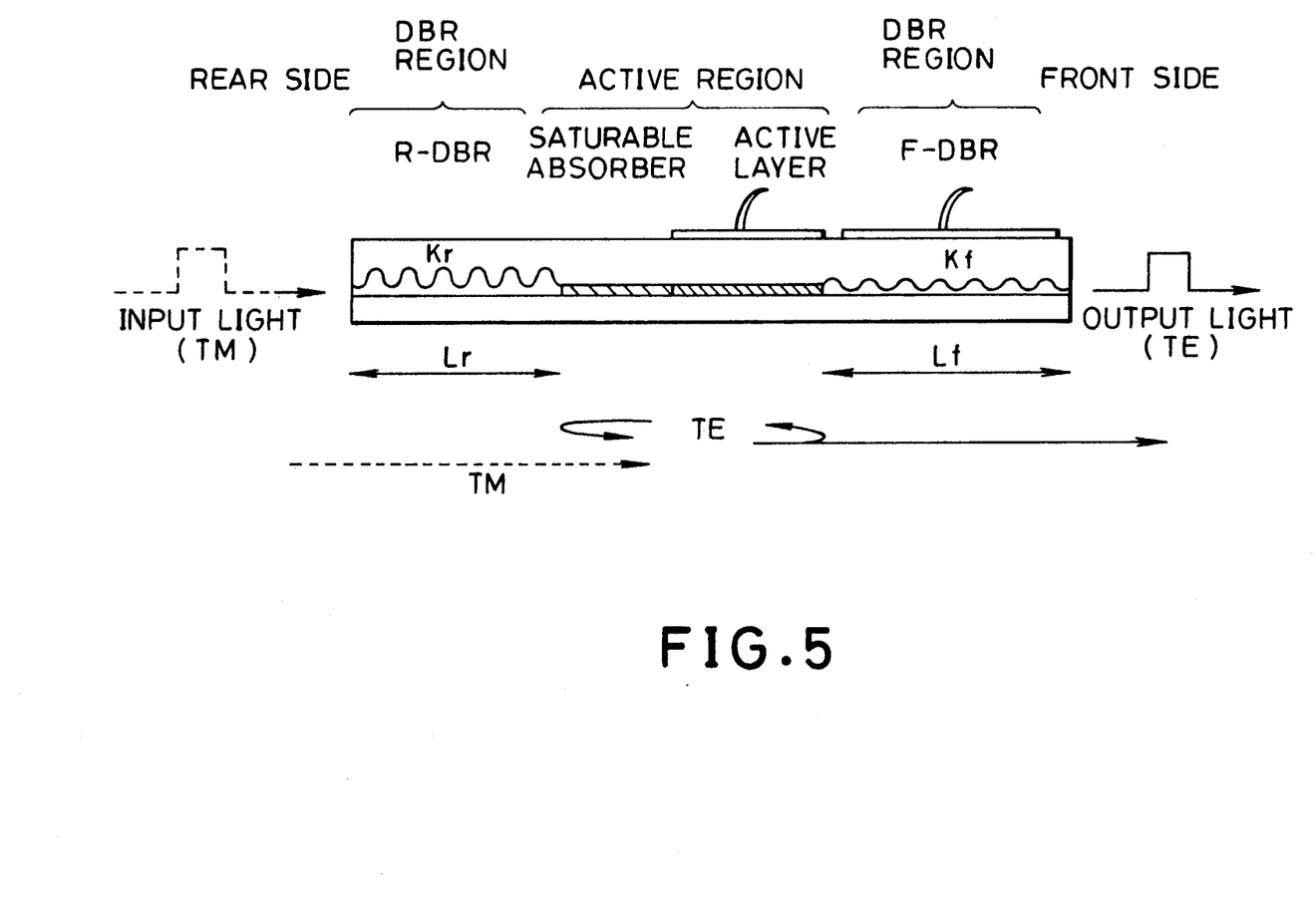
FIG. 5 is a schematic diagram showing a model of the device according to the present invention given for the purpose of explaining the method for determining coupling coefficients adopted in the present invention.

For this purpose, the model shown in FIG. 5 is used as an asymmetrical κ distributed Bragg reflector. Each parameter will be defined as follows:

the coupling coefficient of a distributed Bragg reflector on the input side: $\kappa_r$ the length of the distributed Bragg reflector on the input side: $L_r$ the coupling coefficient of a distributed Bragg reflector on the output side: $\kappa_f$ the length of the distributed Bragg reflector on the output side: $L_f = 300$ μm the loss in a waveguide: $\alpha = 10$ cm$^{-1}$ the power of the output light at the output end: $P_f$ the power of the output light at the input end: $P_r$ (power of the returned light)

isolation ratio which is the ratio of optical powers observed input and output ends: $r = (P_r/P_f)$.

Figure 6:
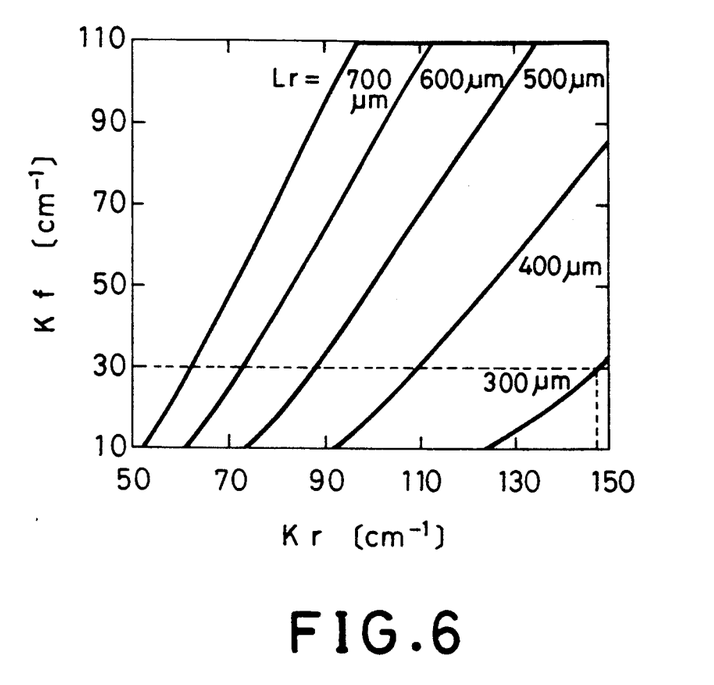
FIGS. 6 and 7 are graphs illustrating the correlation between values of $\kappa_f$ and $\kappa_r$ as functions of a parameter $L_r$, which are used for determining coupling coefficients in the present invention.

FIG. 6 shows the relation between the values $\kappa_f$ and $\kappa_r$ required when the isolation ratio r is defined to be $-30$ dB while $L_r$ is selected as a parameter ($L_f$ is assumed to be 300 μm). When $L_r$ is 300 μm and $\kappa_f$ is 30 cm$^{-1}$, the isolation ratio is improved to be smaller than $-30$ dB (1/1000) is $\kappa_r$ is greater than 150 cm$^{-1}$.

Figure 7:
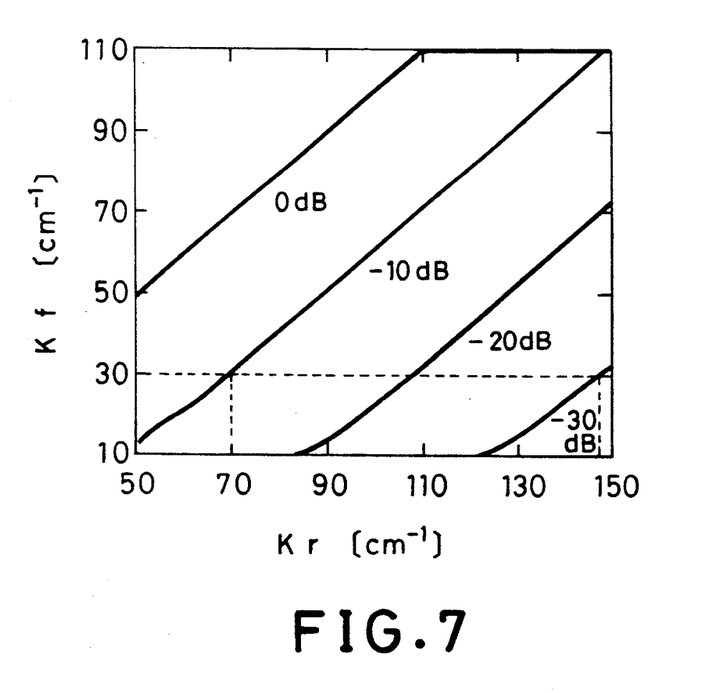

FIG. 7 shows how the isolation ratio varies depending on the relation between the values $\kappa_f$ and $\kappa_r$ when $L_r$ is fixed to 300 μm ($L_f$ is 300 μm). If $\kappa_f$ is 30 cm$^{-1}$, the isolation ratio is equal to $-10$ dB when $\kappa_r$ is 70 cm$^{-1}$ and $-30$ dB when $\kappa_r$ is 145 cm$^{-1}$.

From the foregoing, the preferred range of the coupling coefficient κ is selected such that the isolation ratio is $-10$ dB or less when $L_f = 300$ μm; $L_r = 300$ μm and $\alpha = 10$ cm$^{-1}$, i.e., $\kappa_f < 30$ cm$^{-1}$ $\kappa_r > 70$ cm$^{-1}$.

More preferably, the range is selected such that the isolation ratio is $-30$ dB or less under the same conditions, i.e., $\kappa_f < 30$ cm$^{-1}$ $\kappa_r > 150$ cm$^{-1}$.

As had been explained above, according to the present invention, a wide band distributed reflector which has a reflectivity extremely greater than that of a narrow band distributed reflection mirror portion on the output side of a bistable type wavelength conversion device is arranged on the incident side and the polarization of the input signal light is made to be perpendicular to the polarization of output signal light and the wavelength conversion is performed by tuning the narrow band distributed Bragg reflector mirror portion on the output side. Therefore, according to the present invention, a one-directional device can be assembled by using a polarized light perpendicular to the output signal light as the input signal light and as a result, it is not required to insert an isolator.

A device according to the present invention can easily be monolithically integrated, on the same substrate, alone or in combination with other various devices.

Since the reflectivity of the distributed Bragg reflector on the input side is very high and substantially no converted light returns to the input side, there can be obtained an output light having a high wavelength conversion efficiency and hence a high conversion gain as well as a high output level.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor wavelength conversion device comprising:
   a semiconductor substrate;
   a first cladding layer disposed on said semiconductor substrate;
   a second cladding layer;
   a saturable cladding layer;
   a gain region;
   a distributed Bragg reflector mirror portion including a corrugation grating for selecting wavelength of a wavelength conversion light, said saturable absorber region, said gain region and said distributed Bragg reflector mirror portion being arranged on said first cladding layer;
   first, second and third electrodes separately arranged in areas on said second cladding layer, said areas corresponding to positions of said saturable absorber region, said gain region and said distributed Bragg reflector mirror portion, respectively; and
   a distributed Bragg reflector disposed on the light input side of said saturable absorber region, said distributed Bragg reflector having a corrugation grating which has a coupling coefficient greater than that of said corrugation grating of said distributed Bragg reflector mirror portion, said distributed Bragg reflector transmitting an input signal light of a first polarization mode, wavelength converted light in a second polarization mode which is perpendicular to said first polarization mode being derived from said distributed Bragg reflector mirror portion, a wavelength of said wavelength converted light being controlled by an injection current supplied from said third electrode.

2. The semiconductor wavelength conversion device as claimed in claim 1, wherein said first polarization mode is TM polarization mode and said second polarization mode is TE polarization mode.

3. The semiconductor wavelength conversion device as claimed in claim 1, wherein said first polarization mode is TE polarization mode and said second polarization mode is TM polarization mode.

4. The semiconductor wavelength conversion device as claimed in claim 2, wherein a cross sectional shape of a waveguide in said gain region has a rectangular shape which is short in the direction of the layer thickness so that an optical confinement factor concerning optical confinement of a TE polarization mode light within said gain region is made greater than that of a TM polarization mode light within said gain region, thereby said wavelength converted light in said TE polarization mode being outputted.

5. The semiconductor wavelength conversion device as claimed in claim 3, wherein a cross sectional shape of a waveguide in said gain region has a rectangular shape which is long in the direction of the layer thickness so that an optical confinement factor concerning optical confinement of a TM polarization mode light within said gain region is made greater than that of a TE polarization mode light within said gain region, thereby said wavelength converted light in said TM polarization mode being outputted.

6. The semiconductor wavelength conversion device as claimed in claim 2, wherein said gain region has a unstrained or compressive strained quantum well structure, so that a material gain of said TE polarization mode light is made greater than that of said TM polarization mode light, whereby said wavelength converted light in said TE polarization mode is outputted.

7. The semiconductor wavelength conversion device as claimed in claim 3, wherein said gain region has a quantum well structure having a tensile strain, so that a material gain of said TM polarization mode light is made greater than that of the TE polarization mode light, whereby said wavelength converted light in said TM polarization mode is outputted.

8. The semiconductor wavelength conversion device as claimed in claim 1, wherein said distributed Bragg reflector has an optical waveguide which has a multiple quantum well structure.

9. The semiconductor wavelength conversion device as claimed in claim 1, further comprising an optical amplifier arranged on the input side of said distributed Bragg reflector.

10. The semiconductor wavelength conversion device as claimed in claim 8, further comprising an optical amplifier arranged on the input side of said distributed Bragg reflector.

11. The semiconductor wavelength conversion device as claimed in claim 1, further comprising a distributed feedback filter arranged on the input side of said distributed Bragg reflector.

12. The semiconductor wavelength conversion device as claimed in claim 8, further comprising a distributed feedback filter arranged on the input side of said distributed Bragg reflector.

13. The semiconductor wavelength conversion device as claimed in claim 9, further comprising a polarization mixer arranged on the input side of said optical amplifier.

14. The semiconductor wavelength conversion device as claimed in claim 10, further comprising a polarization mixer arranged on the input side of said optical amplifier.

15. The semiconductor wavelength conversion device as claimed in claim 11, further comprising a polarization mixer arranged on the input side of said distributed feedback filter.

16. The semiconductor wavelength conversion device as claimed in claim 12, further comprising a polarization mixer arranged on the input side of said distributed feedback filter.

17. The semiconductor wavelength conversion device as claimed in claim 1, further comprising a waveguide portion for interrupting said input signal light and selectively transmitting said wavelength converted light, said waveguide portion being arranged on the output side of said distributed Bragg reflector mirror portion.

18. The semiconductor wavelength conversion device as claimed in claim 11, further comprising a waveguide portion for interrupting said input signal light and selectively transmitting said wavelength converted light, said waveguide portion being arranged on the output side of said distributed Bragg reflector mirror portion.

19. The semiconductor wavelength conversion device as claimed in claim 12, further comprising a waveguide portion for interrupting said input signal light and selectively transmitting said wavelength converted light, said waveguide portion being arranged on the output side of said distributed Bragg reflector mirror portion.

20. The semiconductor wavelength conversion device as claimed in claim 15, further comprising a waveguide portion for interrupting said input signal light and selectively transmitting said wavelength converted light, said waveguide portion being arranged on the output side of said distributed Bragg reflector mirror portion.

21. The semiconductor wavelength conversion device as claimed in claim 16, further comprising a waveguide portion for interrupting said input signal light and selectively transmitting said wavelength converted light, said waveguide portion being arranged on the output side of said distributed Bragg reflector mirror portion.

* * * * *